(12) United States Patent
Kinsley (10) Patent No.: US 11,257,792 B2
(45) Date of Patent: Feb. 22, 2022

(54) SEMICONDUCTOR DEVICE ASSEMBLIES WITH ANNULAR INTERPOSERS

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/895,560

(22) Filed: Jun. 8, 2020

(65) Prior Publication Data

US 2020/0303350 A1 Sep. 24, 2020

Related U.S. Application Data

(63) Continuation of application No. 16/006,679, filed on Jun. 12, 2018, now Pat. No. 10,679,970, which is a
(Continued)

(51) Int. Cl.
*H01L 25/065* (2006.01)
*H01L 23/498* (2006.01)
*H01L 25/16* (2006.01)

(52) U.S. Cl.
CPC .... *H01L 25/0657* (2013.01); *H01L 23/49816* (2013.01); *H01L 23/49833* (2013.01);
(Continued)

(58) Field of Classification Search
CPC ......... H01L 23/00; H01L 23/02; H01L 23/34; H01L 23/538; H01L 23/498; H01L 23/49816; H01L 23/49833; H01L 25/16; H01L 25/0657; H01L 2225/06513; H01L 2225/06517; H01L 2225/06548;
(Continued)

(56) References Cited

U.S. PATENT DOCUMENTS 6,376,769 B1 4/2002 Chung
8,618,619 B1 12/2013 Miks et al.
(Continued)

FOREIGN PATENT DOCUMENTS

JP 2002009229 A 1/2002
JP 2010245384 A 10/2010
(Continued)

OTHER PUBLICATIONS

Extended European Search Report dated Nov. 25, 2020 for European Patent Application No. 18757738.2, 9 pages.
(Continued)

*Primary Examiner* — Chuong A Luu
(74) *Attorney, Agent, or Firm* — Perkins Coie LLP (57) ABSTRACT

A semiconductor device package is provided. The package can include a stack of semiconductor dies over a substrate, the substrate including a plurality of electrical contacts, and an annular interposer disposed over the substrate and surrounding the stack of semiconductor dies. The annular interposer can include a plurality of circuit elements each electrically coupled to at least a corresponding one of the plurality of electrical contacts. The package can further include a lid disposed over the annular interposer and the stack of semiconductor dies.

19 Claims, 8 Drawing Sheets

Related U.S. Application Data continuation of application No. 15/621,939, filed on Jun. 13, 2017, now Pat. No. 10,096,576.

(52) U.S. Cl.
CPC .... *H01L 25/16* (2013.01); *H01L 2225/06513* (2013.01); *H01L 2225/06517* (2013.01); *H01L 2225/06548* (2013.01); *H01L 2225/06558* (2013.01); *H01L 2225/06565* (2013.01); *H01L 2225/06582* (2013.01); *H01L 2225/06589* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC . H01L 2225/06558; H01L 2225/06565; H01L 2225/06582; H01L 2225/06589; H01L 2924/15311; H01L 2924/15331; H01L 2924/19041; H01L 2924/19042; H01L 2924/19043; H01L 2924/19105; H01L 21/48; H01L 21/56; H01L 21/563; H01L 21/4882
USPC ...................................................... 257/690
See application file for complete search history.

(56) References Cited

U.S. PATENT DOCUMENTS

| | | | |
|---|---|---|---|
| 9,209,154 B2 | 12/2015 | Lin et al. | |
| 10,090,282 B1 | 10/2018 | Kinsley | |
| 10,096,576 B1 | 10/2018 | Kinsley | |
| 10,546,837 B2 | 1/2020 | Kinsley | |
| 2004/0087043 A1 | 5/2004 | Lee et al. | |
| 2005/0173807 A1 | 8/2005 | Zhu et al. | |
| 2006/0043583 A1 | 3/2006 | Tamagawa et al. | |
| 2007/0018299 A1 | 1/2007 | Koo et al. | |
| 2007/0246813 A1 | 10/2007 | Ong et al. | |
| 2009/0014827 A1 | 1/2009 | Lim et al. | |
| 2009/0166886 A1* | 7/2009 | Kim ...................... | H01L 21/563 257/777 |
| 2009/0243073 A1* | 10/2009 | Carson ................... | H01L 25/03 257/686 |
| 2010/0019377 A1 | 1/2010 | Arvelo et al. | |
| 2010/0230805 A1 | 9/2010 | Refai-Ahmed et al. | |
| 2011/0175218 A1 | 7/2011 | Liou et al. | |
| 2011/0304035 A1 | 12/2011 | Kim et al. | |
| 2012/0049347 A1 | 3/2012 | Wang | |
| 2012/0153448 A1 | 6/2012 | Ihara et al. | |
| 2012/0211867 A1 | 8/2012 | Seroff et al. | |
| 2013/0119528 A1 | 5/2013 | Groothuis et al. | |
| 2013/0341803 A1 | 12/2013 | Cheah et al. | |
| 2014/0084445 A1 | 3/2014 | Lin et al. | |
| 2014/0217575 A1 | 8/2014 | Hung | |
| 2014/0235183 A1 | 8/2014 | Zhao et al. | |
| 2014/0264816 A1 | 9/2014 | Kalchuri et al. | |
| 2015/0041971 A1 | 2/2015 | Lee | |
| 2015/0200175 A1 | 7/2015 | Hatori et al. | |
| 2015/0279431 A1 | 10/2015 | Li et al. | |
| 2015/0279828 A1 | 10/2015 | Koopmans et al. | |
| 2015/0333019 A1 | 11/2015 | Lee et al. | |
| 2016/0013115 A1 | 1/2016 | Vadhavkar et al. | |
| 2016/0013173 A1 | 1/2016 | Vadhavkar et al. | |
| 2016/0148919 A1 | 5/2016 | Nishimura | |
| 2016/0172344 A1 | 6/2016 | We et al. | |
| 2016/0181125 A1 | 6/2016 | Li et al. | |
| 2016/0218085 A1 | 7/2016 | Groothuis et al. | |
| 2016/0254236 A1 | 9/2016 | Kim et al. | |
| 2016/0343687 A1 | 11/2016 | Vadhavkar et al. | |
| 2016/0379967 A1 | 12/2016 | Gamini | |
| 2017/0062394 A1 | 3/2017 | Lin et al. | |
| 2018/0358329 A1 | 12/2018 | Kinsley | |

FOREIGN PATENT DOCUMENTS

| | | |
|---|---|---|
| JP | 2011513994 A | 4/2011 |
| KR | 20110037066 A | 4/2011 |
| KR | 20120127460 A | 11/2012 |
| KR | 101403554 B1 | 6/2014 |

OTHER PUBLICATIONS

Office Action dated Dec. 31, 2020 for Indian Patent Application No. 201927025370, 5 pages (with translation).
Office Action dated Nov. 4, 2020 for Japanese Patent Application No. 2019-566566, 9 pages (with translation).
International Application No. PCT/US2018/015661—PCT International Search Report and Written Opinion, dated Jun. 26, 2018, 15 pages.
International Application No. PCT/US2018/034547—PCT International Search Report and Written Opinion, dated Sep. 14, 2018, 11 pages.
International Application No. PCT/US2018/034549—PCT International Search Report and Written Opinion, dated Sep. 14, 2018, 10 pages.
Koyanagi, Mitsumasa. "The Stacked Capacitor DRAM Cell and Three-Dimensional Memory", IEEE SSCS News, Winter 2008, pp. 37-41.
Office Action dated Feb. 20, 2019 for Taiwan Patent Application No. 107120163, 5 pages.
Search Report dated May 15, 2019 for Taiwan Patent Application No. 107120165, 2 pages (with translation).
Taiwan Patent Application No. 107104874—Taiwan Office Action, dated Oct. 18, 2018, 14 pages.
Office Action dated Aug. 20, 2020 for Korean Patent Application No. 10-2019-7025271, 16 pages (with translation).

* cited by examiner

SEMICONDUCTOR DEVICE ASSEMBLIES WITH ANNULAR INTERPOSERS

CROSS-REFERENCE TO RELATED APPLICATION(S)

This application is a continuation of U.S. application Ser. No. 16/006,679, filed Jun. 12, 2108, which is a continuation of U.S. application Ser. No. 15/621,939, now U.S. Pat. No. 10,679,970, filed Jun. 13, 2017, now U.S. Pat. No. 10,096,576, each of which are incorporated herein by reference in their entirety.

This application contains subject matter related to a U.S. Patent Application by Thomas H. Kinsley, entitled "SEMICONDUCTOR DEVICE ASSEMBLIES WITH ELECTRICALLY FUNCTIONAL HEAT TRANSFER STRUCTURES." The related application, of which the disclosure is incorporated by reference herein, is assigned to Micron Technology, Inc., and was filed on Feb. 24, 2017 with U.S. application Ser. No. 15/442,392.

This application contains subject matter related to a concurrently-filed U.S. Patent Application by Thomas H. Kinsley, entitled "SEMICONDUCTOR DEVICE ASSEMBLIES WITH LIDS INCLUDING CIRCUIT ELEMENTS." The related application, of which the disclosure is incorporated by reference herein, is assigned to Micron Technology, Inc., and was filed on Jun. 13, 2017 with U.S. application Ser. No. 15/621,955.

TECHNICAL FIELD

The present disclosure generally relates to semiconductor devices, and more particularly relates to semiconductor devices having annular interposers.

BACKGROUND

Packaged semiconductor dies, including memory chips, microprocessor chips, and imager chips, typically include a semiconductor die mounted on a substrate and encased in a plastic protective covering or covered by a heat-conducting lid. The die includes functional features, such as memory cells, processor circuits, and/or imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the functional capacity of a semiconductor package without substantially increasing the surface area covered thereby (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

In vertically stacked packages the heat generated by the numerous dies in a small area, together with the height of the die stack, can make thermal management challenging. One approach to thermal management for semiconductor packages with heat-generating die stacks has been to provide a thermally conductive lid attached to both the die stack (for better thermal conduction) and the substrate (for better mechanical stability and die protection). Such lids can either be one-part lids (e.g., with a recess provided for the die stack) or multi-part lids (e.g., with an annular lower lid surrounding the die stack and connecting a planar upper lid to the substrate). Annular lower lids can be expensive to fabricate, and contribute little to the thermal management of the package device (e.g., as most heat is generated in the die stack and conducted vertically to the upper lid). Nevertheless, annular lower lids account for a significant portion of the total volume of the semiconductor package. Accordingly, there is a need for semiconductor packages with better thermal management solutions and more efficient use of space.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for better thermal management solutions and more efficient use of space. Accordingly, several embodiments of semiconductor devices in accordance with the present technology can provide semiconductor device packages with annular interposers that provide additional functionality (e.g., by providing additional space for circuit elements such as capacitors, resistors, etc.) beyond that available with conventional annular lower lids.

Several embodiments of the present technology are directed to semiconductor devices comprising annular interposers. In one embodiment, a semiconductor device package includes a stack of semiconductor dies over a substrate, the substrate including a plurality of electrical contacts, and an annular interposer disposed over the substrate and surrounding the stack of semiconductor dies. The annular interposer can include a plurality of circuit elements each electrically coupled to at least a corresponding one of the plurality of electrical contacts. The package can further include a lid disposed over the annular interposer and the stack of semiconductor dies. Additional annular interposers can be included, depending upon the height of the stack of semiconductor dies and the desired amount of circuit elements.

Specific details of several embodiments of semiconductor device assemblies having annular interposers are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 1A:
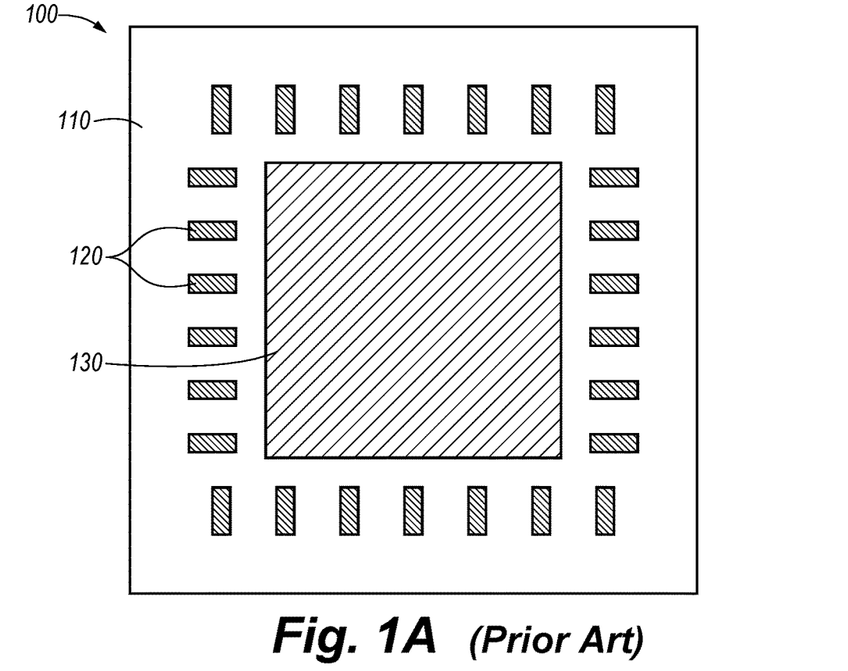
FIGS. 1A through 1E are simplified partial plan and cross-sectional views of a semiconductor device assembly including a two-piece lid.

FIGS. 1A through 1E illustrate partial plan and cross-sectional views of a semiconductor device assembly 100 configured with conventional a two-part lid. FIG. 1A illustrates a plan view of the package substrate 110 of semiconductor device assembly 100. The semiconductor device assembly 100 includes a plurality of circuit elements 120 peripherally disposed on the package substrate 110. The circuit elements 120 can include surface-mounted discrete circuit elements, such as capacitors, resistors, inductors and the like. The semiconductor device assembly 100 further includes a stack 130 of semiconductor dies disposed over a medial region of the upper surface of the package substrate 110 (i.e., between the peripherally disposed circuit elements 120). Both the circuit elements 120 and the stack 130 of semiconductor dies extend upwardly from the upper surface of the package substrate, necessitating a lid that can accommodate these protruding features.

Figure 1B:
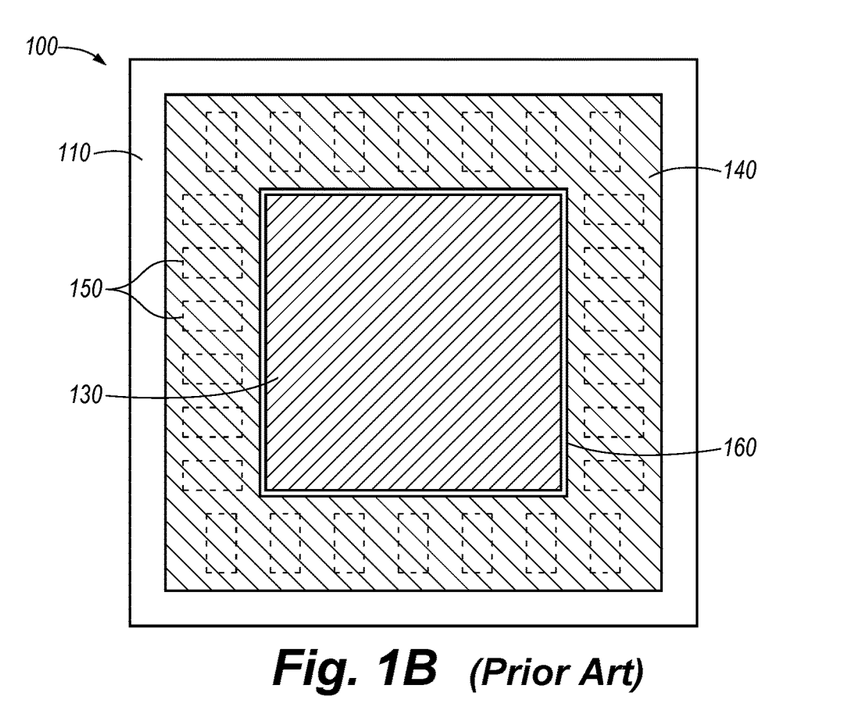

FIG. 1B illustrates a partial plan view of the semiconductor device assembly 100 after a lower lid 140 has been disposed over the package substrate 110. The lower lid 140 includes recesses 150 in a lower surface thereof (illustrated with dashed lines in FIG. 1B) to accommodate the circuit elements 120, and further includes an opening 160 through which the stack 130 of semiconductor dies extends.

Figure 1C:
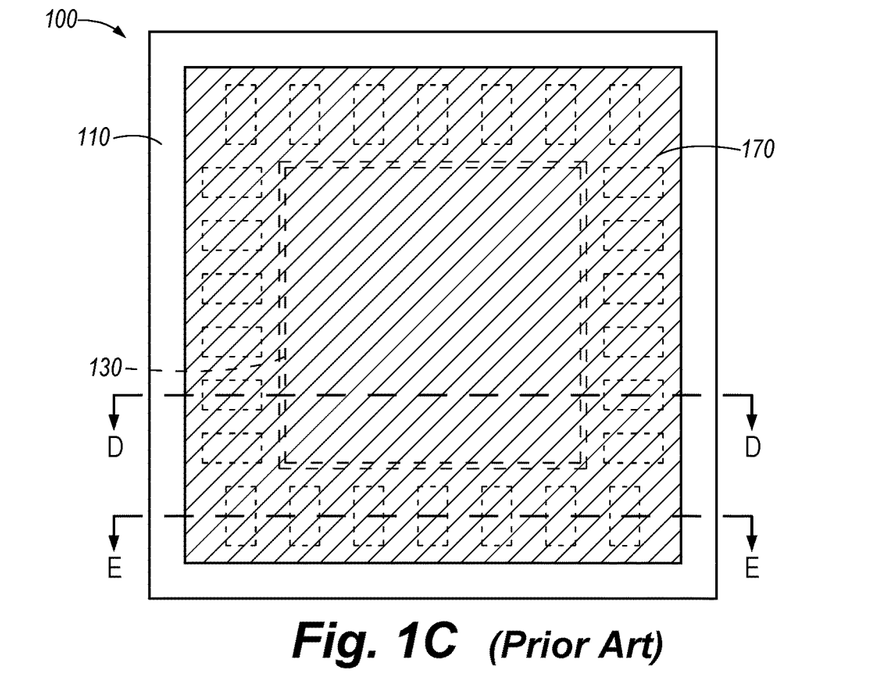
Figure 1D:
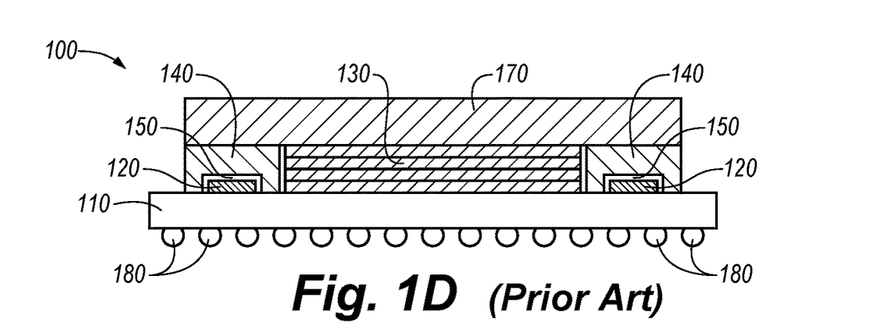
Figure 1E:
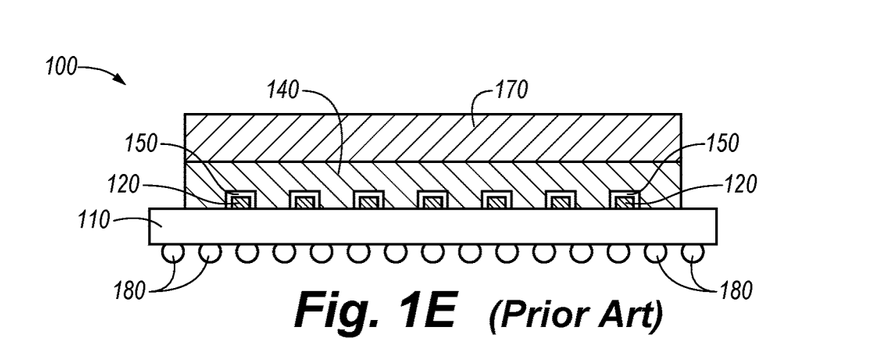

FIG. 1C illustrates a plan view of the semiconductor device assembly 100 after an upper lid 170 has been disposed over the lower lid 140 and stack 130 of semiconductor dies. FIG. 1C includes lines D-D and E-E, illustrating the cross sections along which FIGS. 1D and 1E, respectively, are shown. As can be seen with reference to FIG. 1D, the lower lid 140 has an upper surface approximately co-planar with an upper surface of the stack 130 of semiconductor dies, such that the upper lid 170 can mechanically contact both the upper surface of the lower lid 140 and the upper surface of the stack 130 of semiconductor dies. As can be further seen with reference to both FIGS. 1D and 1E, the recesses 150 permit the lower lid 140 to accommodate the circuit elements 120 that extend upwardly from an upper surface of the package substrate 110. As can also be seen, semiconductor device assembly 100 includes a plurality of package contacts 180 (e.g., solder balls) for providing electrically connectivity to the stack 130 of semiconductor dies and the other circuit elements 120 of the semiconductor device assembly 100.

Given the relatively low amount of heat generated by the circuit elements 120 of the semiconductor device assembly 100, as compared to the stack 130 of semiconductor dies, the lower lid 140 in the conventional design of semiconductor device assembly 100 does not provide significant thermal management benefits, especially in view of its elevated cost of manufacture (e.g., due to the complexity of fabricating an annular metal lid with recesses). Accordingly, embodiments of the present disclosure provide one or more annular interposers configured to support an upper lid, while providing space for additional circuit elements electrically coupled to a package substrate.

Figure 2A:
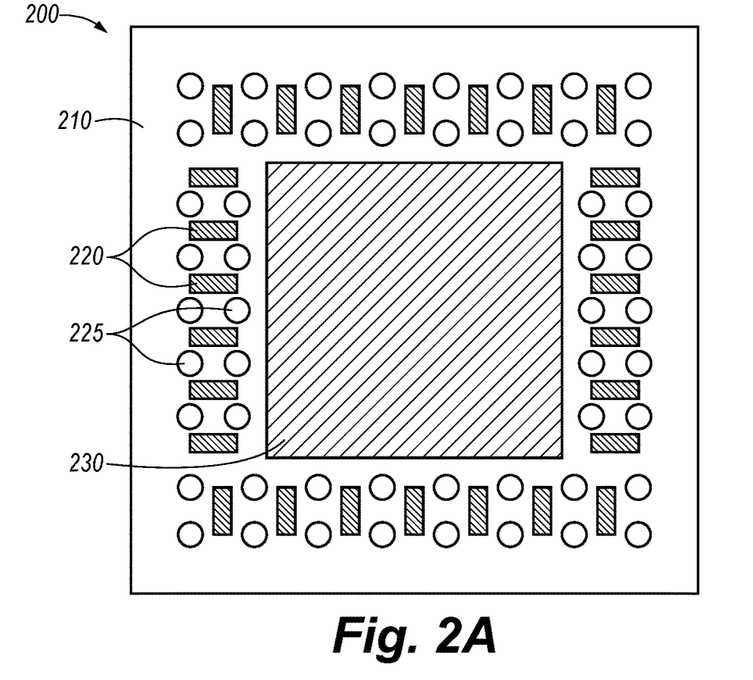
FIGS. 2A through 2E are simplified partial plan and cross-sectional views of a semiconductor device assembly including an annular interposer in accordance with one embodiment of the present technology.

For example, FIGS. 2A through 2E illustrate partial plan and cross-sectional views of a semiconductor device assembly 200 configured in accordance with an embodiment of the present technology. FIG. 2A illustrates a plan view of the package substrate 210 of semiconductor device assembly 200. The semiconductor device assembly 200 includes a first plurality of circuit elements 220 peripherally disposed on the package substrate 210. The first plurality of circuit elements 220 can include surface-mounted discrete circuit elements, such as capacitors, resistors, inductors and the like. The semiconductor device assembly 200 further includes a stack 230 of semiconductor dies disposed over a medial region of the upper surface of the package substrate 210 (e.g., between the peripherally disposed first plurality of circuit elements 220). Both the first plurality of circuit elements 220 and the stack 230 of semiconductor dies extend upwardly from the upper surface of the package substrate. The package substrate 210 also includes a first plurality of electrical contacts 225 disposed peripherally about the stack 230 of semiconductor dies. The first plurality of electrical contacts 225 are configured to provide electrical connectivity to additional circuit elements located on an annular interposer, as is described in greater detail below, with respect to FIG. 2B.

Figure 2B:
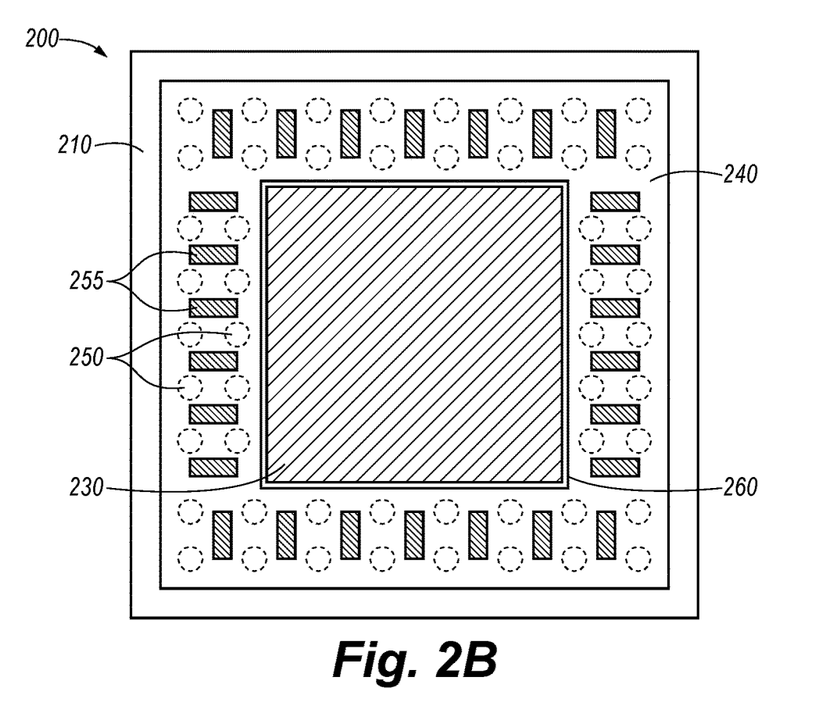

Turning to FIG. 2B, a partial plan view of the semiconductor device assembly 200 is illustrated in accordance with one aspect of the present technology, after an annular interposer 240 has been disposed over the package substrate 210. The annular interposer 240 includes an opening 260 through which the stack 230 of semiconductor dies extends. The annular interposer 240 further includes a substrate on which is mounted a second plurality of circuit elements 255. In the particular embodiment illustrated in FIG. 2B, the second plurality of circuit elements 255 extend upwardly from the upper surface of the substrate of the annular interposer 240. In other embodiments, the second plurality of circuit elements 255 can be mounted on a lower surface thereof, embedded within the substrate, or some combination thereof. The annular interposer 240 further includes a second plurality of electrical contacts 250 on a lower surface of the substrate thereof (illustrated in FIG. 2B with dashed lines), which are configured to be electrically coupled to the first plurality of electrical contacts 225 on the package substrate 210.

Figure 2C:
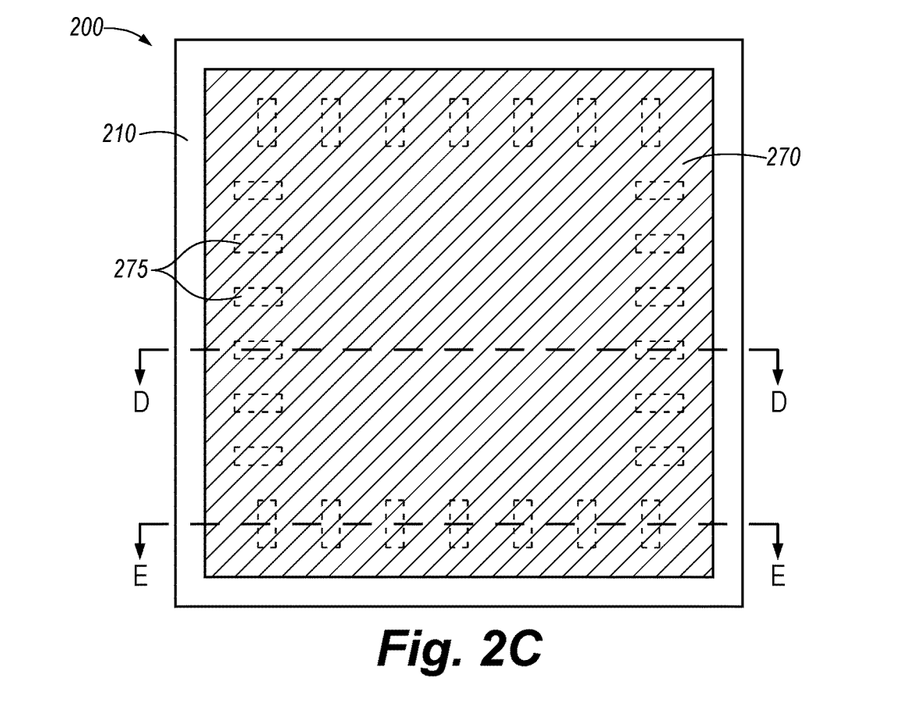
Figure 2D:
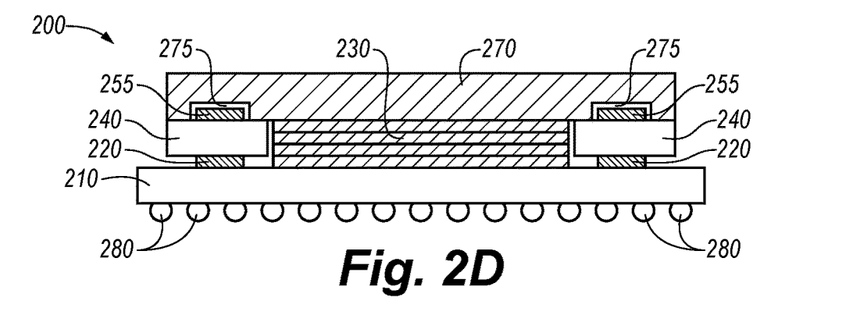

FIG. 2C illustrates a plan view of the semiconductor device assembly 200 in accordance with one aspect of the present technology, after an upper lid 270 has been disposed over the annular interposer 240 and stack 230 of semiconductor dies. The upper lid 270 can include recesses 275 corresponding to the second plurality of circuit elements 255. FIG. 2C includes lines D-D and E-E, illustrating the cross sections along which FIGS. 2D and 2E, respectively, are shown. As can be seen with reference to FIG. 2D, the annular interposer 240 has an upper surface approximately co-planar with an upper surface of the stack 230 of semiconductor dies, such that the upper lid 270 can mechanically contact both the upper surface of the annular interposer 240 and the upper surface of the stack 230 of semiconductor devices. As can be further seen with reference to both FIGS. 2D and 2E, the recesses 275 permit the upper lid 270 to accommodate the second plurality of circuit elements 255 that extend upwardly from an upper surface of the annular interposer 240. Semiconductor device assembly 200 further includes a plurality of package contacts 280 (e.g., solder balls) for providing electrically connectivity to the stack 230 of semiconductor dies and the first and second plurality of circuit elements 220 and 255 of the semiconductor device assembly 200.

Figure 2E:
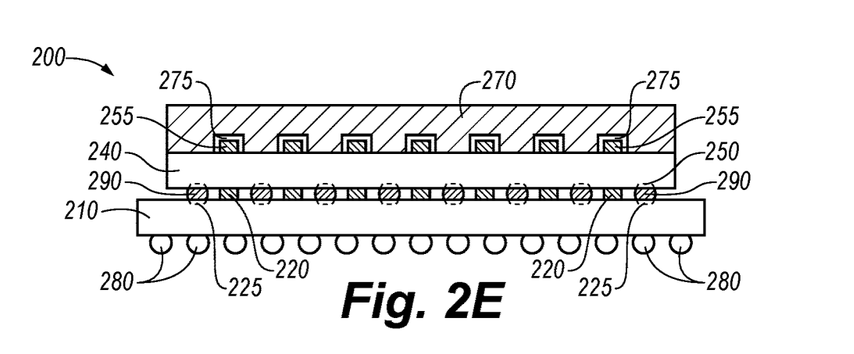

The first and second plurality of electrical contacts 225 and 250 of the package substrate 210 and annular interposer 240, respectively, can be electrically coupled in any one of a variety of ways known to those skilled in the art. For example, FIG. 2E illustrates a plurality of solder joints 290 electrically coupling respective ones of the first and second plurality of electrical contacts 225 and 250. In other embodiments, other interconnect techniques can be used, including, for example, copper-to-copper bonding, pill and pad, interference fit, mechanical, etc. Although not illustrated in FIG. 2D or 2E for the sake of clarity, the semiconductor device assembly 200 can also include a fill material (e.g., underfill, molding material, or the like) between the annular interposer 240 and the package substrate 210, and/or between the annular interposer 240 and the lid 270.

Although in the foregoing embodiment illustrated in FIGS. 2A through 2E, the upper lid 270 is illustrated with recesses 275 accommodating the upwardly-projecting circuit elements 255 on the annular interposer 240, in other embodiments a semiconductor device assembly can include an annular lid configured to interface with an upper lid having a planar lower surface, free of recesses. In this regard, the annular interposer and the plurality of circuit elements thereon can be configured so that the upper surfaces of at least the tallest circuit elements thereon are co-planar with the upper surface of the stack of semiconductor dies, such that a planar lid can be in contact with the uppermost die and at least some of the circuit elements on the annular interposer. Alternatively, the circuit elements of the annular interposer can be provided within the substrate thereof, or extending downwardly from a lower surface thereof, such that the upper surface of the annular interposer is free from upwardly-projecting elements, thereby permitting a lid with a planar lower surface free from recesses to mechanically contact an upper surface of the annular interposer.

Figure 3A:
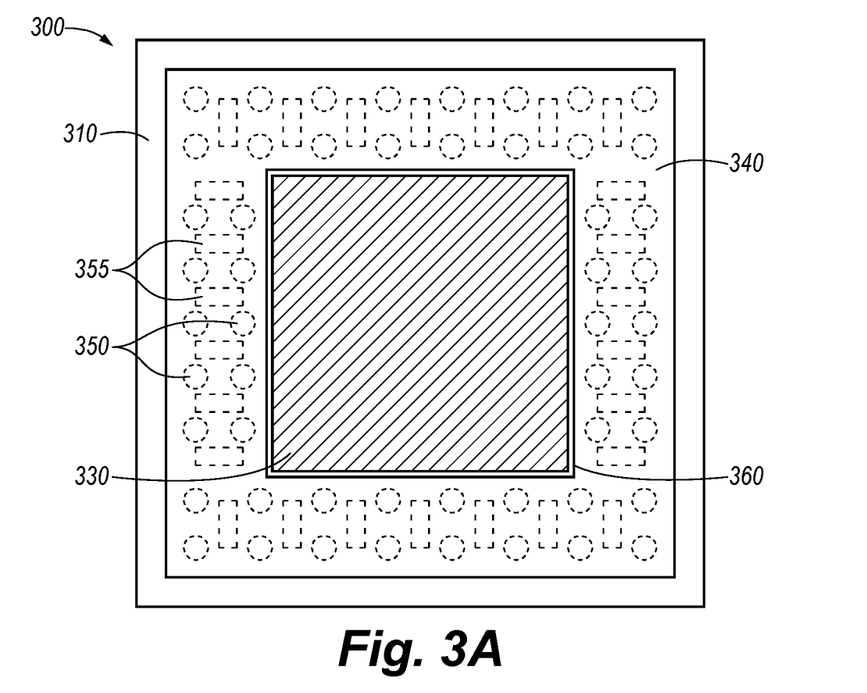
FIGS. 3A through 3D are simplified partial plan and cross-sectional views of a semiconductor device assembly including an annular interposer in accordance with one embodiment of the present technology.

For example, FIGS. 3A through 3D illustrate partial plan and cross-sectional views of a semiconductor device assembly 300 configured in accordance with an embodiment of the present technology, in which an annular interposer with internally disposed circuit elements is provided. FIG. 3A illustrates a partial plan view of a semiconductor device assembly 300 in accordance with one aspect of the present technology. The semiconductor device assembly 300 is illustrated after an annular interposer 340 has been disposed over the package substrate 310, but before an upper lid has been added. The annular interposer 340 includes an opening 360 through which a stack 330 of semiconductor dies extends. The annular interposer 340 further includes a substrate in which is disposed (e.g. under the upper surface thereof, or above the lower surface thereof) a second plurality of circuit elements 355. The annular interposer 340 further includes a second plurality of electrical contacts 350 on a lower surface of the substrate thereof (illustrated in FIG. 2B with dashed lines), which are configured to be electrically coupled to a first plurality of electrical contacts 225 on the package substrate 210.

Figure 3B:
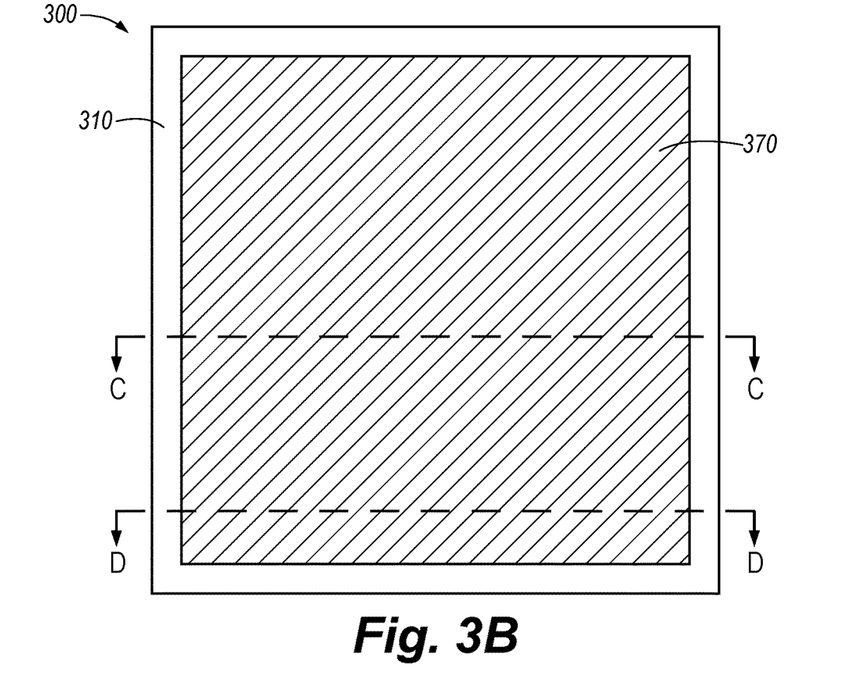
Figure 3C:
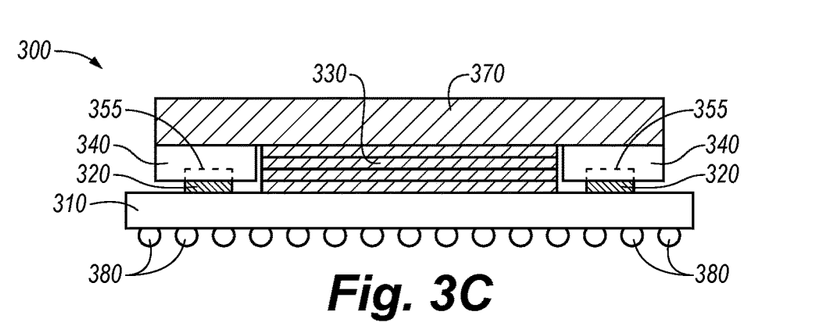

FIG. 3B illustrates a plan view of the semiconductor device assembly 300 in accordance with one aspect of the present technology, after an upper lid 370 has been disposed over the annular interposer 340 and stack 330 of semiconductor dies. FIG. 3B includes lines C-C and D-D, illustrating the cross sections along which FIGS. 3C and 3D, respectively, are shown. As can be seen with reference to FIG. 3C, the annular interposer 340 has an upper surface approximately co-planar with an upper surface of the stack 330 of semiconductor dies, such that the upper lid 370, despite having a planar lower surface substantially free from recesses, can mechanically contact both the upper surface of the annular interposer 340 and the upper surface of the stack 330 of semiconductor devices.

Figure 3D:
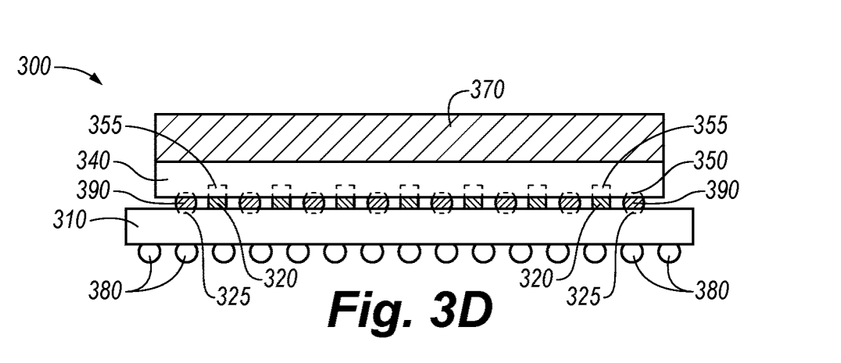

The semiconductor device assembly 300 further includes a first plurality of electrical contacts 325 on the package substrate 310 and a second plurality of electrical contacts 350 on the annular interposer 340. Respective ones of the first and second pluralities of electrical contacts 325 and 350 can be electrically coupled in any one of a variety of ways known to those skilled in the art. For example, FIG. 3D illustrates a plurality of solder joints 390 electrically coupling respective ones of the first and second plurality of electrical contacts 325 and 350. In other embodiments, other interconnect techniques can be used, including, for example, copper-to-copper bonding, pill and pad, interference fit, mechanical, etc. Although not illustrated in FIG. 3C or 3D for the sake of clarity, the semiconductor device assembly 300 can also include a fill material (e.g., underfill, molding material, or the like) between the annular interposer 340 and the package substrate 310, and/or between the annular interposer 340 and the lid 370. The semiconductor device assembly 300 further includes a plurality of package contacts 380 (e.g., solder balls) for providing electrically connectivity to the stack 330 of semiconductor dies and the first and second plurality of circuit elements 320 and 355 of the semiconductor device assembly 300.

Figure 4:
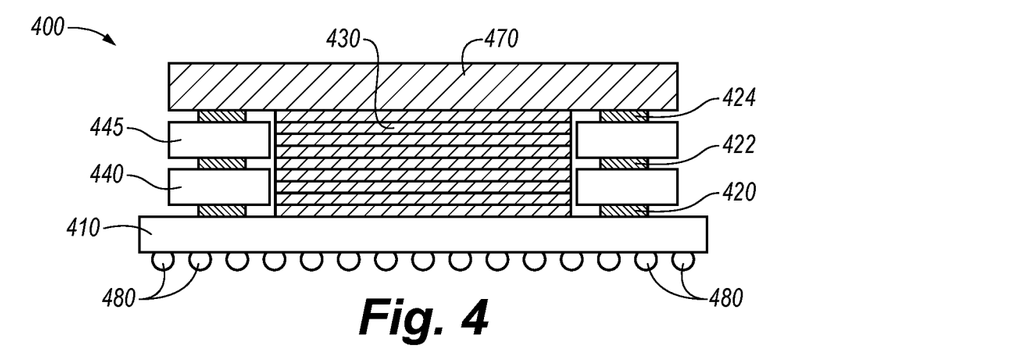
FIG. 4 is a simplified cross-sectional view of a semiconductor device assembly including multiple annular interposers in accordance with one embodiment of the present technology.

Although in the foregoing exemplary embodiments illustrated in FIGS. 2A through 3D, semiconductor device assemblies having a singular annular interposer have been illustrated, other embodiments of the present technology can provide semiconductor device assemblies with multiple annular interposers. For example, FIG. 4 illustrates a cross-sectional view of a semiconductor device assembly 400 in accordance with one aspect of the present technology, in which multiple annular interposers are provided. Semiconductor device assembly 400 includes a package substrate 410, on an upper surface of which is disposed a stack 430 of semiconductor dies. Disposed peripherally about the stack 430 of semiconductor dies are a plurality of circuit elements 420, extending upwardly from an upper surface of the package substrate 410. The package substrate 410 also includes a plurality of electrical contacts (not illustrated in the cross-sectional view of FIG. 4) arranged peripherally about the stack 430 of semiconductor dies, configured to provide electrical connectivity to circuit elements 422 and 424 disposed on the first and second annular interposers 440 and 445.

The first and second annular interposers 440 and 445 each include an opening through which the stack 430 of semiconductor dies extends, and each include a plurality of circuit elements 422 and 424 disposed thereon, and electrically coupled to the plurality of electrical contacts on the package substrate. In this regard, the first annular interposer 440 may include pass-through electrical contacts (e.g., vias and leads, not shown) for providing electrical connectivity between some of the electrical contacts of the package substrate 410 and the plurality of circuit elements 424 of the second annular interposer 445. The semiconductor device assembly 400 further includes a lid 470, which has a planar lower surface in contact with the uppermost die in the stack 430 of semiconductor dies, as well as the circuit elements 424 which are co-planar with the uppermost die. The semiconductor device assembly 400 further includes a plurality of package contacts 480 (e.g., solder balls) for providing electrically connectivity to the stack 430 of semiconductor dies and the first, second and third pluralities of circuit elements 420, 422 and 424 of the semiconductor device assembly 400.

Figure 5:
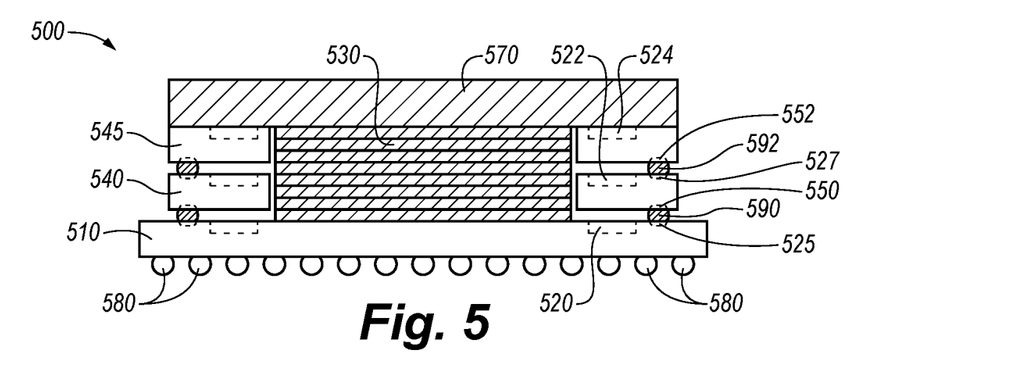
FIG. 5 is a simplified cross-sectional view of a semiconductor device assembly including multiple annular interposers in accordance with one embodiment of the present technology.

Turning to FIG. 5, yet another semiconductor die assembly 500 having multiple annular interposers is illustrated in cross-section in accordance with an embodiment of the present technology. The semiconductor device assembly 500 includes a package substrate 510, on an upper surface of which is disposed a stack 530 of semiconductor dies. Arranged peripherally about the stack 530 of semiconductor dies are a first plurality of circuit elements 520, disposed within an upper layer of the package substrate 510. The package substrate 510 also includes a first plurality of electrical contacts 525 arranged peripherally about the stack 530 of semiconductor dies, configured to provide electrical connectivity to circuit elements 522 and 524 disposed on the first and second annular interposers 540 and 545.

The first and second annular interposers 540 and 545 each include an opening through which the stack 530 of semiconductor dies extends, and each include a plurality of circuit elements 522 and 524 disposed therein and electrically coupled to the plurality of electrical contacts 525 on the package substrate 510. In this regard, the first annular interposer 540 can include a second plurality of electrical contacts 550 corresponding to the first plurality of electrical contacts 525 on the package substrate 510, some of which provide electrical connectivity to the second plurality of circuit elements 522 on the first annular interposer 540, and others of which are coupled to a third plurality of electrical contacts 527 that provide electrical connectivity to the third plurality of circuit elements 524 on the second annular interposer 545 (e.g., through a fourth plurality of electrical contacts 552 thereon). Respective ones of the first and second pluralities of electrical contacts 525 and 550, and of the third and fourth pluralities of electrical contacts 527 and 552, can be electrically coupled in any one of a variety of ways known to those skilled in the art. For example, FIG. 5 illustrates first and second pluralities of solder joints 590 and 592 electrically coupling respective ones of the first and second pluralities of electrical contacts 525 and 550, and of the third and fourth pluralities of electrical contacts 527 and 552. In other embodiments, other interconnect techniques can be used, including, for example, copper-to-copper bonding, pill and pad, interference fit, mechanical, etc.

The semiconductor device assembly 500 further includes a plurality of package contacts 580 (e.g., solder balls) for providing electrically connectivity to the stack 530 of semiconductor dies and the first, second and third plurality of circuit elements 520, 522 and 524 of the semiconductor device assembly 500. The semiconductor device assembly 500 further includes a lid 570, which has a planar lower surface in contact with the uppermost die in the stack 530 of semiconductor dies, as well as the upper surface of the second annular interposer 545, which is co-planar with the uppermost die.

Although in the foregoing exemplary embodiments the semiconductor device assemblies have been illustrated with either one or two annular interposers, in other embodiments semiconductor device assemblies can be provided with any number of annular interposers (e.g., one, two, three, four, five, eight, ten, sixteen, etc.). Moreover, although the example embodiments illustrated in the foregoing figures have shown semiconductor device assemblies in which circuit elements and package substrate electrical contacts are provided peripherally surrounding a stack of semiconductor dies, in other embodiments, the circuit elements and/or package substrate electrical contacts may be on less than all sides of a die stack (e.g., on one side, on two opposing or adjacent sides, on three sides, etc.).

Figure 6:
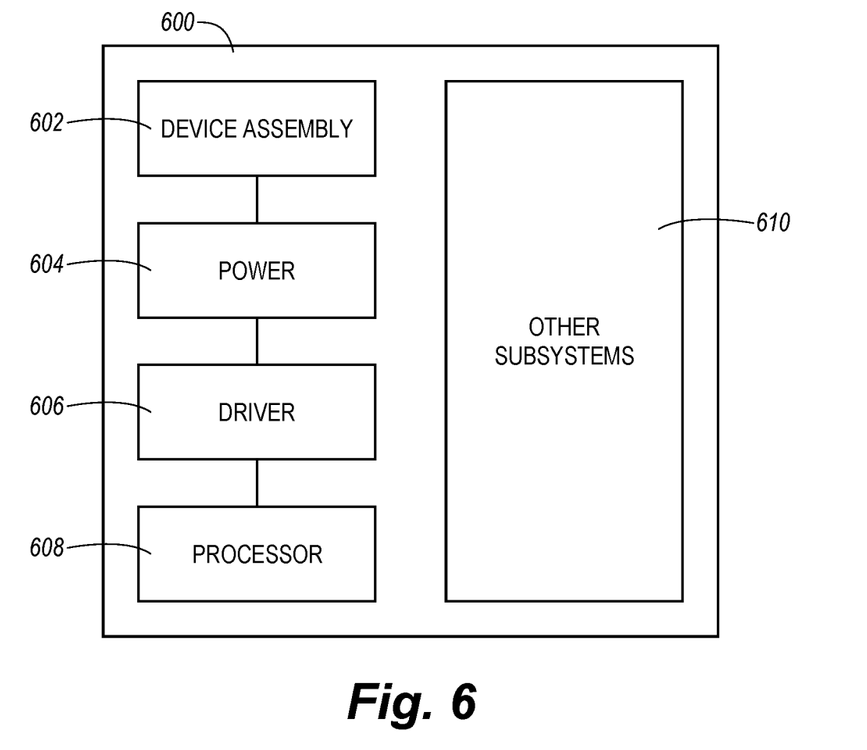
FIG. 6 is a schematic view showing a system that includes a semiconductor device assembly configured in accordance with an embodiment of the present technology.

Any one of the stacked semiconductor device assemblies described above with reference to FIGS. 2A-5 can be incorporated into any of a myriad of larger and/or more complex systems, a representative example of which is system 600 shown schematically in FIG. 6. The system 600 can include a semiconductor device assembly 602, a power source 604, a driver 606, a processor 608, and/or other subsystems or components 610. The semiconductor device assembly 602 can include features generally similar to those of the semiconductor device assemblies described above with reference to FIGS. 2A-5, and can therefore include one or more annular interposers. The resulting system 600 can perform any of a wide variety of functions, such as memory storage, data processing, and/or other suitable functions. Accordingly, representative systems 600 can include, without limitation, hand-held devices (e.g., mobile phones, tablets, digital readers, and digital audio players), computers, vehicles, appliances and other products. Components of the system 600 may be housed in a single unit or distributed over multiple, interconnected units (e.g., through a communications network). The components of the system 600 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device package, comprising:
at least one semiconductor die over a substrate;
the substrate including a plurality of electrical contacts electrically coupled to the at least one semiconductor die; and
an annular interposer disposed over the substrate and surrounding the at least one semiconductor die, the annular interposer including a plurality of circuit elements each electrically coupled to the at least one semiconductor die.

2. The semiconductor device package of claim 1, wherein the plurality of circuit elements extend upwardly from an upper surface of the annular interposer.

3. The semiconductor device package of claim 1, wherein the plurality of circuit elements are located within a substrate of the annular interposer.

4. The semiconductor device package of claim 1, wherein the plurality of circuit elements comprise one or more capacitors, resistors, and/or inductors.

5. The semiconductor device package of claim 1, wherein the plurality of circuit elements are each electrically coupled to the at least one semiconductor die via at least one of the plurality of electrical contacts.

6. The semiconductor device package of claim 1, wherein the plurality of circuit elements is a first plurality of circuit elements, and wherein the substrate further includes a second plurality of circuit elements.

7. The semiconductor device package of claim 6, wherein the second plurality of circuit elements extend upwardly from an upper surface of the substrate.

8. The semiconductor device package of claim 7, wherein a lower surface of the annular interposer is in contact with at least one of the second plurality of circuit elements.

9. The semiconductor device package of claim 6, wherein the second plurality of circuit elements are disposed peripherally around the at least one semiconductor die.

10. The semiconductor device package of claim 1, wherein the annular interposer is a first annular interposer, and further comprising a second annular interposer disposed over the first annular interposer and surrounding the at least one semiconductor die, the second annular interposer including a second plurality of circuit elements each electrically coupled to the at least one semiconductor die.

11. The semiconductor device package of claim 1, further comprising a fill material between the annular interposer and the substrate.

12. A semiconductor device assembly, comprising:
a substrate having an upper surface with a plurality of electrical contacts thereon;
at least one semiconductor die disposed over the upper surface of the substrate, the at least one semiconductor die extending above the upper surface of the substrate by a first height;
a first plurality of circuit elements disposed over the upper surface of the substrate peripherally to the at least one semiconductor die, the plurality of circuit elements extending above the upper surface of the substrate by a second height less than the first height; and
an annular interposer disposed over the plurality of circuit elements, the annular interposer including an opening through which the at least one semiconductor die extends, the annular interposer further including a second plurality of circuit elements, each of the second plurality of circuit elements being electrically coupled to the at least one semiconductor die.

13. The semiconductor device assembly of claim 12, wherein the second plurality of circuit elements extend upwardly from an upper surface of the annular interposer.

14. The semiconductor device assembly of claim 12, wherein the second plurality of circuit elements are located within a substrate of the annular interposer.

15. The semiconductor device assembly of claim 12, wherein the first plurality of circuit elements and the second plurality of circuit elements each comprises one or more capacitors, resistors, and/or inductors.

16. The semiconductor device assembly of claim 12, wherein the second plurality of circuit elements are each electrically coupled to the at least one semiconductor die via at least one of the plurality of electrical contacts.

17. The semiconductor device assembly of claim 12, wherein the first and second plurality of circuit elements are disposed peripherally around the at least one semiconductor die.

18. The semiconductor device assembly of claim 12, wherein the annular interposer is a first annular interposer, and further comprising a second annular interposer disposed over the first annular interposer and surrounding the at least one semiconductor die, the second annular interposer including a third plurality of circuit elements each electrically coupled to the at least one semiconductor die.

19. The semiconductor device assembly of claim 14, further comprising a fill material between the annular interposer and the substrate.

* * * * *